United States Patent [19]

Bertotti et al.

[11] 4,319,262
[45] Mar. 9, 1982

[54] INTEGRATED-CIRCUIT STRUCTURE INCLUDING LATERAL PNP TRANSISTOR WITH POLYSILICON LAYER BRIDGING GAP IN COLLECTOR FIELD RELIEF ELECTRODE

[75] Inventors: Franco Bertotti, Milan; Vincenzo Prestileo, Arese; Mario Foroni, Valeggio sul Mincio, all of Italy

[73] Assignee: SGS-ATES Componenti Elettronici S.p.A., Agrate-Brianza, Italy

[21] Appl. No.: 120,923

[22] Filed: Feb. 12, 1980

[30] Foreign Application Priority Data

Feb. 13, 1979 [IT] Italy .............................. 20139 A/79

[51] Int. Cl.³ .......................................... H01L 29/72
[52] U.S. Cl. ..................................... 357/35; 357/53; 357/59
[58] Field of Search .............................. 357/35, 53, 59

[56] References Cited

U.S. PATENT DOCUMENTS

| 3,443,173 | 5/1969 | Tsang et al. | 357/35 |
| 3,600,651 | 8/1971 | Duncan | 357/59 |
| 4,125,853 | 11/1978 | Fulton et al. | 357/35 |

FOREIGN PATENT DOCUMENTS 1400150 4/1965 France .................................. 357/53

*Primary Examiner*—Joseph E. Clawson, Jr.

*Attorney, Agent, or Firm*—Karl F. Ross

[57] ABSTRACT

A lateral PNP transistor with concentric p-doped emitter and collector diffusion zones in an n-doped base layer epitaxially grown on a p-type silicon substrate, covered by a layer of silicon oxide, has emitter and collector electrodes in the form of metallic patches on the oxide layer overlying the respective diffusion zones and penetrating the oxide at limited contact areas. The metallic patches extend above an annular base-layer portion separating the two diffusion zones and symmetrically approach a circular centerline of this annular portion in order to guard against punch-through upon accidental polarity reversal of the collector/emitter voltage. A narrow peripheral gap in the collector electrode is traversed by an elongate metal strip which forms a radial extension of the emitter electrode leading to a supply terminal, the spacing of that strip from the gap edges substantially equaling the radial distance between the confronting peripheral boundaries of the two patches. If the diffusion zone of the collector is peripherally continuous instead of being interrupted in the region of the gap of the overlying electrode, the gap is bridged by a stratum of p-doped polycrystalline silicon embedded in the oxide layer and in conductive contact with the collector electrode on opposite sides of the gap, this stratum having an edge complementing the inner boundary of the metallic collector patch to a full circle around the emitter patch.

6 Claims, 4 Drawing Figures

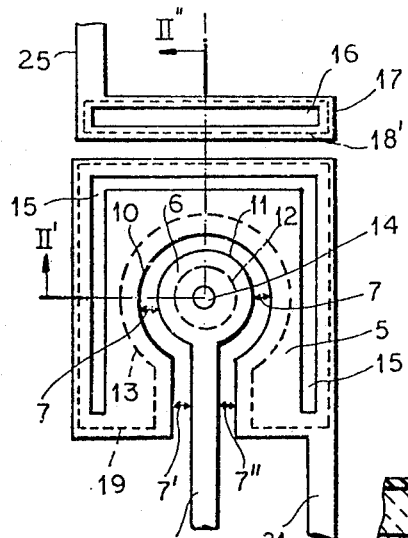
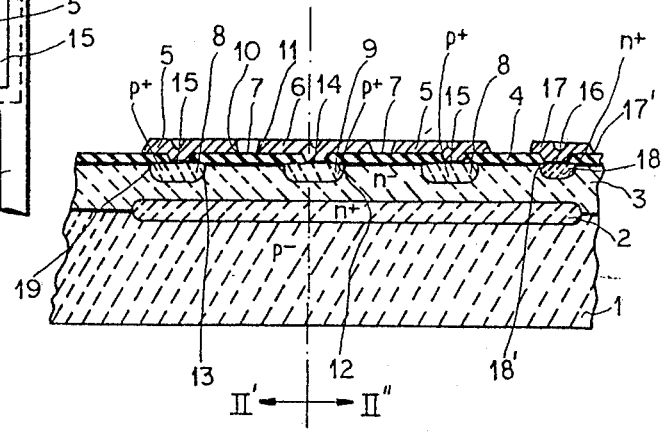
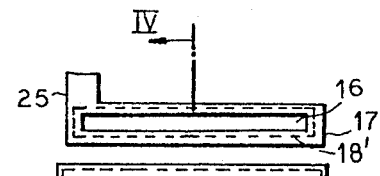
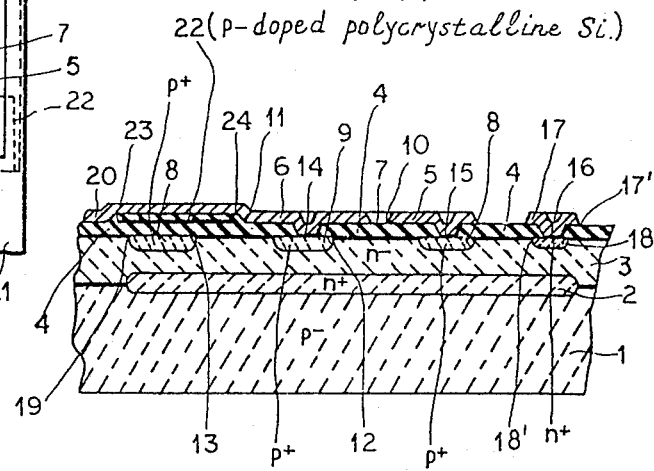

INTEGRATED-CIRCUIT STRUCTURE INCLUDING LATERAL PNP TRANSISTOR WITH POLYSILICON LAYER BRIDGING GAP IN COLLECTOR FIELD RELIEF ELECTRODE

FIELD OF THE INVENTION

Our present invention relates to a lateral PNP transistor which forms part of an integrated semiconductor structure of the type wherein a monocrystalline silicon substrate of p-type conductivity is overlain by an epitaxially grown silicon layer of n-type conductivity which in turn is covered by a layer of silicon oxide.

BACKGROUND OF THE INVENTION

It is known, e.g. from U.S. Pat. Nos. 3,197,710 and 3,412,460, to form the emitter and conductor regions of such a PNP transistor as concentric zones into which p-type impurities are diffused concurrently with the formation of other components in the same substrate, such as a vertical NPN transistor. The inner and outer diffusion zones representing the emitter and collector regions are concentrically separated by a base region which is part of the epitaxial layer.

In normal operation, the p/n junction existing between the base and collector regions (i.e. along the inner periphery of the generally annular outer diffusion zone) is reverse-biased with resulting formation of a depletion zone in the adjoining base region. When the reverse bias exceeds a certain threshold voltage, the electric field across the oxide layer tends to produce an inversion layer in the underlying epitaxial layer. The likelihood of the formation of such an inversion layer increases with higher open-circuit collector/emitter breakdown voltage $V_{(BR)CEo}$. The appearance of this inversion layer depends not only on the applied collector potential and the extent of the depletion zone but also on the charge concentration in the base region which in turn can be modified by the accumulation of charges in and above the overlying portion of the oxide layer. Thus, it has already been proposed to inhibit the development of an inversion layer, which in effect acts as an extension of the emitter region, by enlarging the metallized area constituting the emitter electrode to let that area overlie the base region separating the two diffusion zones. This measure allows the use of increased breakdown voltages $V_{(BR)CEo}$ without the danger of punch-through with the normal mode of energization of the transistor.

Nevertheless, the risk of punch-through exists in the event of accidental voltage inversion which may happen, for example, when the silicon wafer incorporating the transistor is connected in an external circuit as a replacement of electromechanical components previously utilized therein. In such an event the depletion zone may merge with the inversion layer to cause a destructive short circuit unless the transistor is protected by resistive elements, e.g. diodes, in series with its emitter or collector. The presence of such series elements, however, increases the voltage drop across the semiconductor component during high-current operation to an extent which may be inadmissible in some instances.

OBJECTS OF THE INVENTION

The general object of our present invention, therefore, is to provide an improved structure for a lateral PNP transistor of high breakdown voltage, free from ancillary protective components, which is designed to prevent punch-through also in the case of accidental polarity reversals.

A more particular object is to provide convenient means for conductively connecting a centrally positioned emitter electrode of such a transistor to an external circuit.

SUMMARY OF THE INVENTION

In accordance with our present invention, the emitter and collector electrodes are respectively formed as a first and a second conductive patch on the oxide layer, in contact with the associated inner and outer diffusion zones, which extend beyond the peripheries of these zones so as to overlie adjoining peripheral areas of the intervening base region, these patches having confronting boundaries spaced apart by a substantially uniform distance which is significantly smaller than the width of the base region.

The second patch, constituting the collector electrode, as well as a third conductive patch, constituting an outlying base electrode in conductive contact with the epitaxial layer, can be readily connected to an external circuit via leads in the form of conductive strips on the surface of the oxide layer. For the first patch constituting the emitter electrode, however, such a connection is feasible only where the second patch is interrupted by a peripheral gap providing clearance for a conductor strip extending outward from the emitter electrode. Since the second patch must overhang the entire inner peripheral boundary of the collector region to guard against reverse-voltage punch-through, the collector region must also be interrupted underneath the gap—over a distance exceeding the gap width—unless the second patch can be extended into a full ring while still remaining insulated from the emitter lead. For this purpose, pursuant to a more particular feature of our invention, there may be provided a conductive stratum embedded in the oxide layer while approaching the periphery of the first patch with a spacing therefrom substantially corresponding to the distance between the confronting patch boundaries, this stratum being in conductive contact with the second patch on opposite sides of the gap bridged thereby.

The conductive material used for the patches may be metal, in conformity with the usual practice, but could also be p-doped polycrystalline silicon. We particularly prefer the latter material for the embedded stratum.

BRIEF DESCRIPTION OF THE DRAWING

The above and other features of our invention will now be described in detail with reference to the accompanying drawing in which:

FIG. 1 is a plan view of a portion of a silicon wafer incorporating a lateral PNP transistor according to our invention;

FIG. 2 is a cross-sectional view, drawn to a larger scale, which is taken on the lines II'—II'' of FIG. 1;

FIG. 3 is a plan view similar to FIG. 1, illustrating a modification; and

FIG. 4 is a cross-sectional view similar to FIG. 2 but taken on the line IV—IV of FIG. 3.

SPECIFIC DESCRIPTION

In FIG. 2 we have shown a substrate 1 of monocrystalline silicon with p⁻ conductivity on which a base layer 3 with n⁻ doping has been epitaxially grown by conventional techniques. At the interface of substrate 1 and epitaxial layer 3 there is shown a buried layer 2 of n+ conductivity which may from part of an associated vertical NPN transistor not further illustrated.

A PNP transistor according to our invention (see also FIG. 1) comprises a central emitter region 9 with a substantially circular periphery 12, a surrounding collector region 8 with an inner periphery 13 and an outer periphery 19, and an intervening base region formed by a portion of layer 3. The two concentric regions 9 and 8 are of p+ conductivity and are covered, together with the remainder of layer 3, by a dielectric layer 4 of silicon oxide which is penetrated along localized areas by portions 14 and 15 of overlying metal patches 6 and 5 respectively constituting an emitter electrode and a collector electrode. A third patch 17 is disposed on layer 4 above an enclave 18 of n+ conductivity in layer 3 which it contacts along a limited area of penetration 16; patch 17, serving as a base electrode, has a rectangular boundary 17' encompassing the rectangular outline 18' of enclave 18.

Patches 5 and 6 have substantially circular confronting boundaries 10 and 11 separated by a substantially uniform radial distance 7 which is a minor fraction of the width of the base region lying between the inner periphery 13 of collector region 8 and the outer periphery 12 of emitter region 9. The collector region, however, does not completely surround the emitter region but is generally horseshoe-shaped whereby its inner and outer peripheries 13 and 19 form part of a common outline. The overlying metallic patch 5 is of similar configuration but extends inwardly beyond the outline 13, 19 of diffusion zone 8 so as to define a radial gap somewhat narrower than the peripheral interruption of that zone. This gap is radially traversed by a narrow conductor strip 20 which is integral with the metallic patch 6 and thus forms an emitter lead extending to an external power supply. The spacing of strip 20 from the gap edges, indicated at 7' and 7" in FIG. 1, substantially corresponds to the distance 7 separating the two concentric boundaries 10 and 11 from each other. FIG. 1 also shows a collector lead 21, integral with patch 5, and a base lead 25, integral with patch 17; the sites for these two leads may be more or less freely chosen.

Distance 7 should, of course, be sufficient to prevent any shorting between the emitter and collector electrodes, with due regard to the voltage difference existing therebetween and the dielectric strength of the oxide layer 4 which generally allows for a maximum voltage drop of about 600 V/$\mu$. With a breakdown voltage $V_{(BR)CEo}$ of at least 120 V, the width of the base region between the zonal peripheries 12 and 13 should be about 25 to 30$\mu$. Distance 7 may be less than half of that width, e.g. one-third or less, and in practice may be about 8 to 10$\mu$, though lower values are at least theoretically admissible.

Though the structure of FIGS. 1 and 2 provides adequate safeguards against punch-through in the event of a voltage reversal, the interruption of the periphery 13 of the collector region over a significant arc length (up to roughly 90°) entails a reduction of transistor gain in comparison with an otherwise identical structure with a continuous collector region completely encompassing the emitter region. If high gain is important, therefore, we prefer to use the structure shown in FIGS. 3 and 4 which differs from that of FIGS. 1 and 2 in that the diffusion zone 8 is of closed configuration with distinct inner and outer peripheries 13 and 19. The collector electrode formed by the metallic patch 5 still has the same horseshoe shape as in the preceding embodiment, thereby forming a gap traversed by the emitter lead 20 with symmetrical clearances 7' and 7". Underneath that emitter lead 20, however, there is embedded in the oxide layer 4 a stratum 22 of p-doped polycrystalline silicon which bridges the gap of patch 5 and is in conductive contact with that patch on both sides of the gap. An arcuate inner boundary 24 of stratum 22 complements the peripheral boundary 10 of patch 5 to a full circle spaced by the distance 7 from the boundary 11 of emitter electrode 6. As in the previous embodiment, these two boundaries symmetrically approach a circular centerline of the intervening base region from which they are spaced by half the distance 7.

From FIG. 4 it will be noted that the metallic conductor strip 20 is insulated from the conductive stratum 22 by a continuous portion of the oxide layer 4 which is somewhat thickened at the location of that stratum.

In principle, the stratum 22 can be formed before or after the diffusion of p-type impurities into the collector and emitter zones 8 and 9. If this is done before the diffusion process, the stratum must be limited to the width of a relatively narrow masking portion of layer 4 beneath which the impurities of the collector zone may diffuse within base layer 3 upon introduction through adjoining windows in the oxide layer. If the polycrystalline stratum 22 is produced after the doping of the collector zone, it may be substantially wider (e.g. as shown in FIG. 3) so that the peripheral extent of the metal patch 5 can be reduced to provide sufficient clearance for an emitter lead of any convenient width.

The transistor structure shown in the drawing will generally be surrounded, within the epitaxial layer 3, by an annular barrier of p-type material which has not been illustrated.

We claim:

1. A lateral transistor forming part of an integrated semiconductor structure which includes a monocrystalline silicon substrate of p-type conductivity, an epitaxial silicon layer of n-type conductivity on said substrate and an oxide layer overlying said epitaxial layer, comprising:

a p-doped inner diffusion zone in said epitaxial layer forming an emitter region immediately below said oxide layer;

a p-doped outer diffusion zone in said epitaxial layer forming a collector region in the form of a closed ring spacedly surrounding said emitter region immediately below said oxide layer, said emitter and collector regions being separated by a base region of substantially constant width forming part of said epitaxial layer;

a first conductive patch on said oxide layer forming an emitter electrode overlying said inner diffusion zone in conductive contact therewith and therebeyond above an adjoining inner peripheral area of said base region;

a second conductive patch on said oxide layer forming a collector electrode overlying said outer diffusion zone in conductive contact therewith and therebeyond above an adjoining outer peripheral area of said base region, said second patch concentrically surrounding said first patch except for a peripheral gap, said patches having confronting boundaries spaced apart by a substantially uniform distance significantly smaller then the width of said base region;

a third conductive patch on said oxide layer forming a base electrode overlying said epitaxial layer in conductive contact therewith at a location outside said second patch;

conductor means extending from said patches to an external circuit, said conductor means including a strip of conductor material extending from said first patch on said oxide layer through said gap with a separation from the gap edges substantially corresponding to the distance between said confronting boundaries; and a conductive stratum embedded in said oxide layer and bridging said gap while approaching the periphery of said first patch with a spacing therefrom substantially corresponding to the distance between said confronting boundaries, said stratum being in conductive contact with said second patch on opposite sides of said gap.

2. A lateral transistor forming part of an integrated semiconductor structure which includes a monocrystalline silicon substrate of p-type conductivity, an epitaxial silicon layer of n-type conductivity on said substrate and an oxide layer overlying said epitaxial layer, comprising:

a p-doped inner diffusion zone in said epitaxial layer forming an emitter region immediately below said oxide layer;

a p-doped outer diffusion zone in said epitaxial layer forming a collector region spacedly surrounding said emitter region immediately below said oxide layer, said emitter and collector regions being separated by a base region of substantially constant width forming part of said epitaxial layer;

a first conductive patch on said oxide layer forming an emitter electrode overlying said inner diffusion zone in conductive contact therewith and therebeyond above an adjoining inner peripheral area of said base region;

a second conductive patch on said oxide layer forming a collector electrode overlying said outer diffusion zone in conductive contact therewith and therebeyond above an adjoining outer peripheral area of said base region, said patches having confronting boundaries substantially equispaced from a centerline of said base region and spaced apart by a substantially uniform distance of less than half the width of said base region;

a third conductive patch on said oxide layer forming a base electrode overlying said epitaxial layer in conductive contact therewith at a location outside said second patch; and conductor means extending from said patches to an external circuit.

3. A PNP transistor as defined in claim 2 wherein said second patch concentrically surrounds said first patch except for a peripheral gap, said conductor means including a strip of conductor material extending from said first patch on said oxide layer through said gap with a separation from the gap edges substantially corresponding to the distance between said confronting boundaries.

4. A PNP transistor as defined in claim 3 wherein said collector region is interrupted underneath said gap over a distance exceeding the gap width.

5. A PNP transistor as defined in claim 3 wherein said collector region forms a closed ring around said emitter region, further comprising a conductive stratum embedded in said oxide layer and bridging said gap while approaching the periphery of said first patch with a spacing therefrom substantially corresponding to the distance between said confronting boundaries, said stratum being in conductive contact with said second patch on opposite sides of said gap.

6. A PNP transistor as defined in claim 5 or 1 wherein said patches are metallic, said stratum consisting of p-doped polycrystalline silicon.

* * * * *